(12) United States Patent
Finke et al.

(10) Patent No.: US 8,026,727 B2
(45) Date of Patent: Sep. 27, 2011

(54) CIRCUIT ARRANGEMENT AND SYSTEM FOR USE IN A MOTOR VEHICLE

(75) Inventors: Benjamin Finke, Schiefling am See (AT); Herbert Gietler, Villach (AT); Gerhard Zojer, Schiefling am See (AT)

(73) Assignee: Infineon Technologies AG, Neubiberg (DE)

(*) Notice: Subject to any disclaimer, the term of this patent is extended or adjusted under 35 U.S.C. 154(b) by 302 days.

(21) Appl. No.: 12/463,230

(22) Filed: May 8, 2009

(65) Prior Publication Data

US 2009/0278404 A1    Nov. 12, 2009

(30) Foreign Application Priority Data

May 8, 2008    (DE) .......................... 10 2008 022744

(51) Int. Cl.
*G01R 31/02*    (2006.01)

(52) U.S. Cl. ...................................... 324/550; 324/537
(58) Field of Classification Search .................. None
See application file for complete search history.

(56) References Cited

U.S. PATENT DOCUMENTS 6,091,273 A    7/2000    Bernstein et al.
7,696,760 B2*  4/2010    Lindsey et al. ............... 324/538

FOREIGN PATENT DOCUMENTS

DE    10127385 C2    10/2003

* cited by examiner

*Primary Examiner* — Minh N Tang
(74) *Attorney, Agent, or Firm* — Lee & Hayes, PLLC

(57) ABSTRACT

A circuit arrangement comprises a fuse element from which degradation can start. The circuit arrangement also comprises a sensor element for detecting the degradation, and a circuit part to be protected. The sensor element can detect degradation into a region between the fuse element and the circuit part to be protected.

25 Claims, 9 Drawing Sheets

CIRCUIT ARRANGEMENT AND SYSTEM FOR USE IN A MOTOR VEHICLE

RELATED APPLICATIONS

This application claims the benefit under 35 USC §119 to German Patent Application No. 102008022744.7 filed May 8, 2008, naming Benjamin Finke, Herbert Gietler and Gerhard Zojer as inventors.

BACKGROUND

So-called fuses and antifuses have a multiplicity of possible uses, in particular in integrated semiconductor circuits. They are used, for example, to replace defective memory cells with redundant memory cells or to provide the integrated semiconductor circuit with a unique identifier. Furthermore, fuses and antifuses are used to trim an analog circuit part, for example a bandgap circuit.

An antifuse can be programmed by establishing an electrically conductive connection in an integrated semiconductor module. A fuse can be programmed by severing an electrically conductive connection in an integrated semiconductor module. For example, a metal line is deliberately severed by the energy of a laser pulse when programming a fuse. Insulating layers which surround the metal line may be damaged in the process. Therefore, after the programming operation, there is the risk of moisture entering the semiconductor module and corroding the metal line which has been severed. The corrosion may also extend to surrounding circuit parts. This constitutes a problem, in particular when the fuse is used in a safety-critical application.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

In the following, with reference to the accompanying FIGS. 1 to 12, embodiments of a circuit arrangement and system for use in a motor vehicle are explained in detail.

Figure 1:
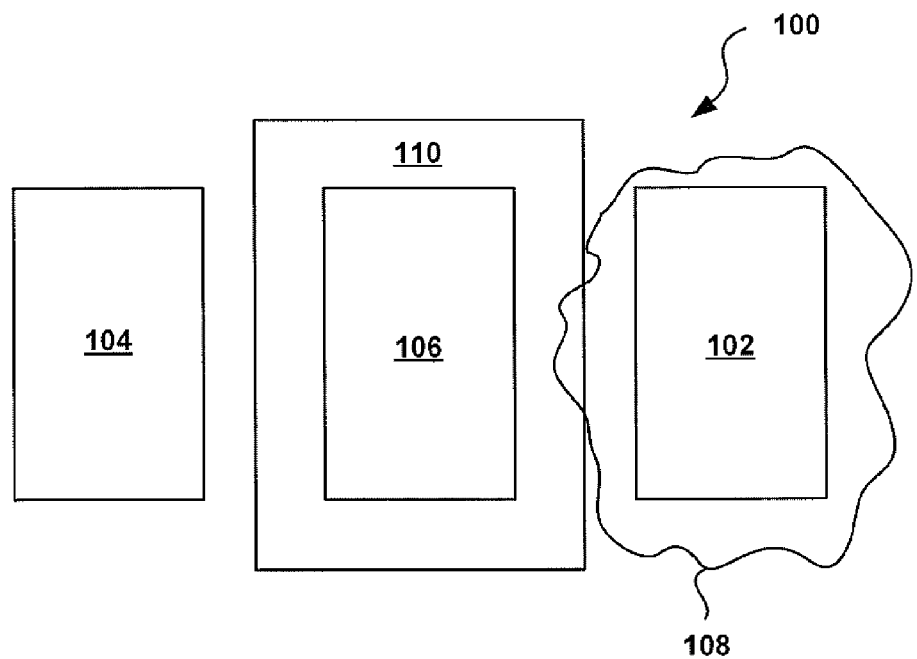
FIG. 1 is a diagram of one embodiment of a circuit arrangement.

FIG. 1 shows a diagrammatic illustration of one embodiment of a circuit arrangement. The circuit arrangement 100 comprises a fuse element 102 from which degradation 108 can start. A circuit part 104 to be protected, the function of which must not be disrupted by the degradation 108, is also shown. A sensor element 106 is arranged in a region 110 between the fuse element 102 and the circuit part 104 to be protected. The arrangement means that the sensor element 106 changes its state on account of the degradation 108 before the circuit part 104 to be protected is affected by the degradation 108. The sensor element 106 is used to detect entry of the degradation 108, which starts from the fuse element 102, into the region 110 between the fuse element 102 and the circuit part 104 to be protected.

Figure 2:
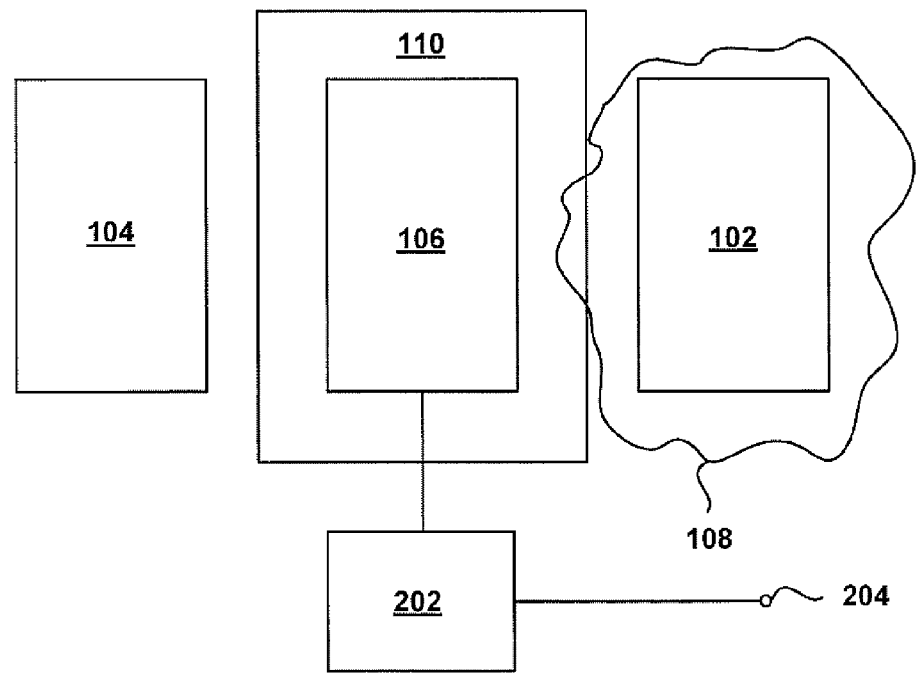
FIG. 2 is a diagram of another embodiment of a circuit arrangement.

FIG. 2 shows a diagrammatic illustration of another embodiment of a circuit arrangement. In addition to the embodiment illustrated in FIG. 1, FIG. 2 shows an evaluation circuit 202 which is coupled to the sensor element 106. The evaluation circuit 202 evaluates a state of the sensor element 106 and provides a signal 204 at an output. The signal 204 can be used to detect when the sensor element 106 changes its state on account of the degradation 108.

In one embodiment, the signal 204 is coupled to the circuit part 104 to be protected. For example, the evaluation circuit 202 activates the signal 204 when it detects that the degradation 108 starting from the fuse element 102 reaches the sensor element 106. The circuit part 104 to be protected can thus be switched off before it is affected by the degradation 108 which starts from the fuse element 102. As a result of the fact that it is switched off, faulty behavior of the circuit part 104 to be protected, which is caused by degradation 108, is prevented. This is important, in particular, in safety-critical applications since faulty behavior of a circuit must be prevented by all means in such applications.

In one embodiment, the signal 204 is used as a warning signal to warn of faulty behavior of the circuit part 104 to be protected. For example, the signal 204 is coupled to a counter and an output of the counter is coupled to the circuit part 104 to be protected. The counter temporally delays the signal 204. The circuit part 104 to be protected can thus be switched off a particular amount of time after the evaluation circuit 202 has detected a change in the state of the sensor element 106.

The fuse element 102, the circuit part 104 to be protected and the sensor element 106 may be formed in an integrated semiconductor module. The evaluation circuit 202 may be arranged in the same integrated semiconductor module or may be arranged separately.

The degradation 108 which starts from the fuse element 102 may be a physical and/or chemical change of structures. For example, it may be corrosion of a metal line, which is caused by the ingress of moisture. It may also be crack formation in a metal line, which is caused by thermal loading, for example by repeatedly heating and cooling the semiconductor module.

There are different types of fuse elements 102. A distinction is made between so-called fuses and so-called antifuses in semiconductor technology. Fuses and antifuses are irreversibly programmable storage elements.

An antifuse is a fuse element which is nonconductive in an unprogrammed state. It comprises two partial line elements which are arranged at a distance from one another. The antifuse is programmed by establishing a connection between the two partial line elements. A dielectric layer which has a high impedance in the unprogrammed state and at which a break is produced during programming may be situated between the two partial line elements.

A fuse is a fuse element which is conductive in an unprogrammed state. It comprises a line element and is programmed by severing the line element.

Fuses and antifuses can be programmed using a laser. In this case, the energy of a pulsed laser establishes a connection between the two partial line elements in an antifuse. In a fuse, the energy of the pulsed laser severs the line element.

In another type of fuse and antifuse, the latter are programmed using a current pulse. In this case, a sufficiently high current pulse is applied to a fuse or antifuse, with the result that a connection is established between the two partial line elements in an antifuse and the line element is severed in a fuse.

Fuses and antifuses are irreversibly programmable storage elements. There is admittedly the risk of separate connections at least partially growing together again in a fuse during operation, but this is an undesirable effect. In the case of an antifuse, there is the risk of the two partial line elements at least partially separating again during operation. This is also an undesirable effect.

The embodiments described and shown below relate to laser fuses, which are formed in a semiconductor module, and are examples and representatives of other types of fuse elements which can be used in a circuit arrangement. Connections between the laser fuse and a read-out circuit, which is used to read out a value stored in the laser fuse, are not illustrated in the embodiments shown below for reasons of clarity.

Figure 3:
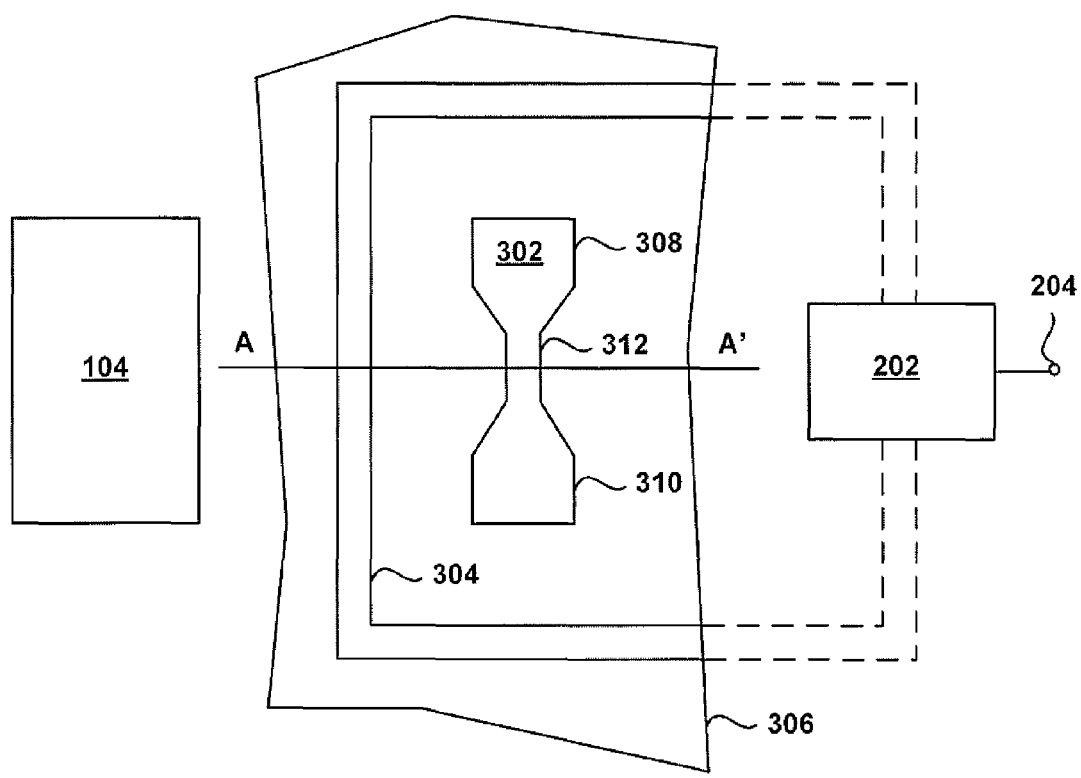
FIG. 3 is a diagram of another embodiment of a circuit arrangement.
Figure 4:
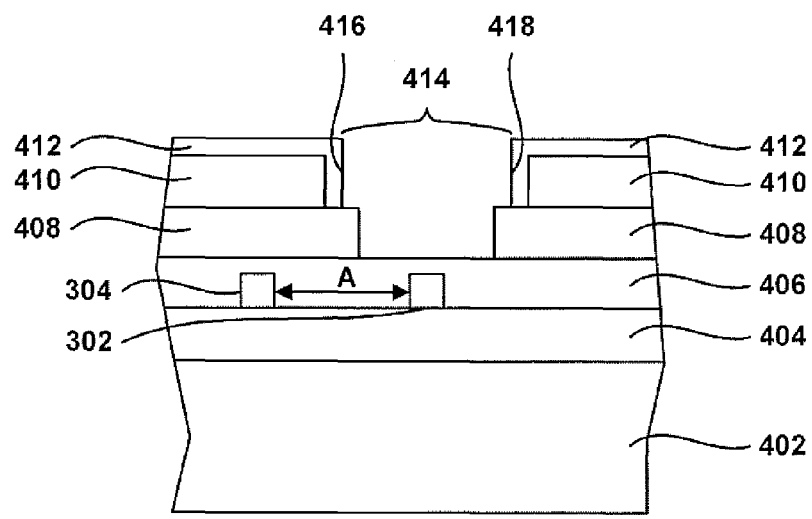
FIG. 4 is a diagram of a cross section of a section illustrated in FIG. 3.
Figure 5:
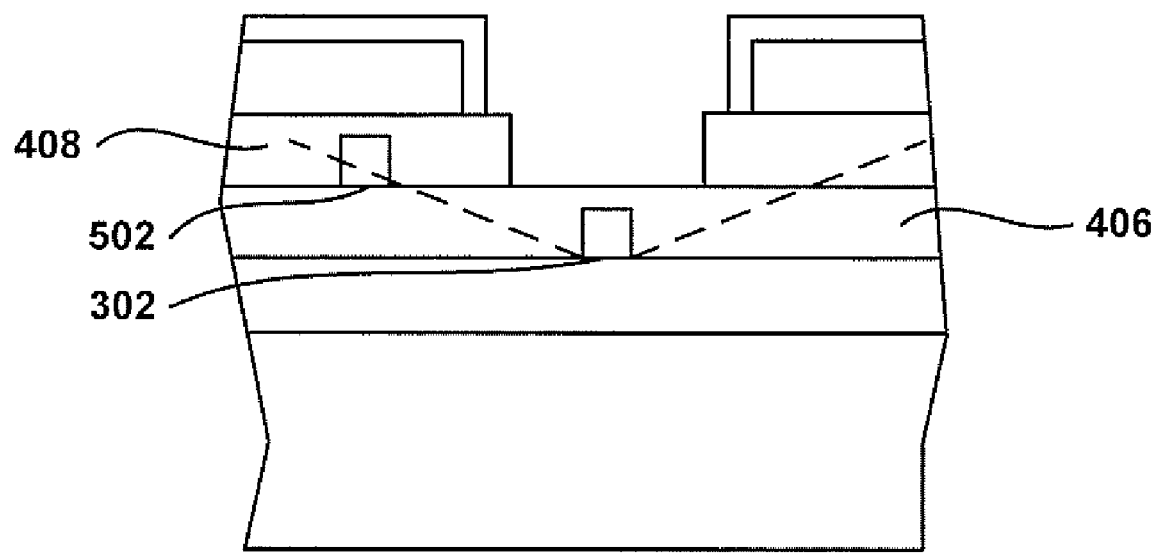
FIG. 5 is a diagram of another embodiment of a circuit arrangement.

FIG. 3 shows a diagrammatic illustration of another embodiment of a circuit arrangement. In this case, a section 306 is illustrated in a plan view, and FIG. 4 shows a cross section of the section 306 along the line A-A'.

FIG. 3 shows a fuse 302, a conductor track 304 and a circuit part 104 to be protected, which are all formed in a semiconductor module. An evaluation circuit 202 which is coupled to the conductor track 304, as indicated using dashed lines, is also shown. The fuse 302 is illustrated in an unprogrammed state and a first connection 308 of the fuse 302 is connected to a second connection 310 of the fuse 302 via a connecting link 312. The first connection 308 and the second connection 310 of the fuse 302 are coupled to a read-out circuit which has not been illustrated in FIG. 3 for reasons of clarity.

In order to program the fuse 302, a pulsed laser is aimed at the connecting link 312 and the connecting link 312 is severed. As a result of the connecting link 312 being severed, there is the risk of degradation starting from the fuse 302. The degradation may be, for example, corrosion which is caused by the ingress of moisture and/or may be crack formation which is caused by thermal loading.

The conductor track 304 is intended to prevent the function of the circuit part 104 to be protected from being affected by the degradation during operation. The conductor track 304 is used as a sensor element and is arranged in a region between the fuse 302 and the circuit part 104 to be protected. This arrangement means that the conductor track 304 is affected by degradation, which starts from the fuse 302, before the circuit part 104 to be protected. In the case of corrosion or crack formation which starts from the fuse 302 and extends in the direction of the circuit part 104 to be protected, the conductor track 304 is damaged or severed. The evaluation circuit 202 evaluates a state of the conductor track 304 and provides a signal 204 at an output. For example, the evaluation circuit 202 activates the signal 204 when it detects that the conductor track 304 has been damaged or severed. In one embodiment, the signal 204 is coupled to the circuit part 104 to be protected, and the circuit part 104 to be protected is switched off when the signal 204 becomes active. The circuit part 104 to be protected is deactivated even before the degradation which starts from the fuse 302 reaches it. Faulty behavior of the circuit part 104 to be protected is prevented.

In the plan view (illustrated in FIG. 3) of the section 306, the conductor track 304 and the fuse 302 are arranged in a conductor track plane formed above a semiconductor substrate, and the conductor track 304 is arranged around the fuse 302 in a u-shaped manner. The conductor track 304 is arranged adjacent to the sides facing the first connection 308, the second connection 310 and the circuit part 104 to be protected. The side facing the first connection 308 is referred to as the top side of the fuse 302 below and the side facing the second connection 310 is referred to as the underside of the fuse 302 below. This arrangement means that not only degradation which spreads from the fuse 302 in the direction of the circuit part 104 to be protected is detected. Degradation which extends into regions above the first connection 308 or below the second connection 310 is also detected. The u-shaped conductor track 304 is one exemplary embodiment of the sensor element 106 shown in FIG. 1 and FIG. 2. The sensor element 106 may be configured in different ways. For example, the configuration of the sensor element 106 may be adapted to the shape and position of the circuit part 104 to be protected.

Degradation which starts from the laser fuse 302 in the direction of the region 104 to be protected is detected in the embodiment illustrated in FIG. 3. The time at which the laser is inaccurately aligned during programming of the laser fuse 302 and the conductor track 304 is severed instead of the connecting link 312 of the fuse 302 is also detected.

FIG. 4 shows a diagrammatic illustration of an embodiment of a cross section of the section 306 illustrated in FIG. 3 along the line A-A'. A first conductor track plane 404 which contains an electrically nonconductive material, for example silicon oxide, as a dielectric is formed on a semiconductor substrate 402. The first conductor track plane 404 may contain electrically conductive polysilicon regions (not illustrated). A second conductor track plane 406 which is formed above the first conductor track plane 404 likewise contains an electrically nonconductive material. The fuse 302 and the conductor track 304 are also formed in the second conductor track plane 406. The second conductor track plane 406 is, for example, a metal plane, the fuse 302 and the conductor track 304 being formed from an electrically conductive material, for example aluminum or copper. A third conductor track plane 408 is formed above the second conductor track plane 406, and a fourth conductor track plane 410 is formed above the third conductor track plane 408. Like in the second conductor track plane 406, conductor tracks (not illustrated) may also be formed in the third conductor track plane 408 and in the fourth conductor track plane 410. Polysilicon regions of the first conductor track plane 404 may be connected to conductor tracks of the second conductor track plane 406 via plated-through holes. Conductor tracks of the second conductor track plane 406 may likewise be connected to conductor tracks of the third conductor track plane 408 and conductor tracks of the third conductor track plane 408 may be connected to conductor tracks of the fourth conductor track plane 410 via plated-through holes.

An opening 414 is formed in the third conductor track plane 408 and in the fourth conductor track plane 410 in a region corresponding to the position of the fuse 302. The opening 414 makes it possible to blow the connecting link 312 of the fuse 302 by means of a laser beam. A passivation layer 412 is formed on the fourth conductor track plane 410 and along the two side walls 416, 418 of the opening 414. The passivation layer 412 is formed, for example, from silicon nitride or silicon oxide and is used, inter alia, to prevent the ingress of moisture into the semiconductor module.

Moisture can enter the semiconductor module, in particular when the fuse 302 is in a programmed state, since the passivation layer is missing in the region of the opening 414. Degradation starting from the fuse 302 may be produced. Degradation starting from the fuse 302 in the direction of the circuit 104 to be protected is detected using the conductor track 304. The conductor track 304 is arranged at a distance A from the fuse 302. The closer the conductor track 304 is arranged to the fuse 302, the earlier the degradation can be detected using the conductor track 304. In one exemplary embodiment, the distance A between the fuse 302 and the conductor track 304 corresponds to a minimum distance which, for a particular technology, can be implemented between two structures in the same conductor track plane.

In the embodiment illustrated in FIG. 4, the conductor track 304 and the fuse 302 are arranged in the second conductor track plane 406. In another embodiment, the conductor track 304 and the fuse 302 may be arranged in the first conductor track plane 404, in the third conductor track plane 408 or in the fourth conductor track plane 410. In another embodiment, the conductor track and the fuse are in different conductor track planes. For example, in an embodiment illustrated in FIG. 5, a conductor track 502 is arranged in the third conductor track plane 408 which is directly above the second conductor track plane 406 in which the fuse 302 is arranged. Corrosion caused by moisture spreads from the fuse 302 over a plurality of conductor track planes in a conical manner, as indicated using dashed lines in FIG. 5. The conductor track 502 in the third conductor track plane 408 is affected by the corrosion earlier than a conductor track which, as illustrated in FIG. 4, is in the second conductor track plane 406. Corrosion starting from the fuse 302 is detected earlier with the embodiment illustrated in FIG. 5 than with the embodiment illustrated in FIG. 4.

Figure 6:
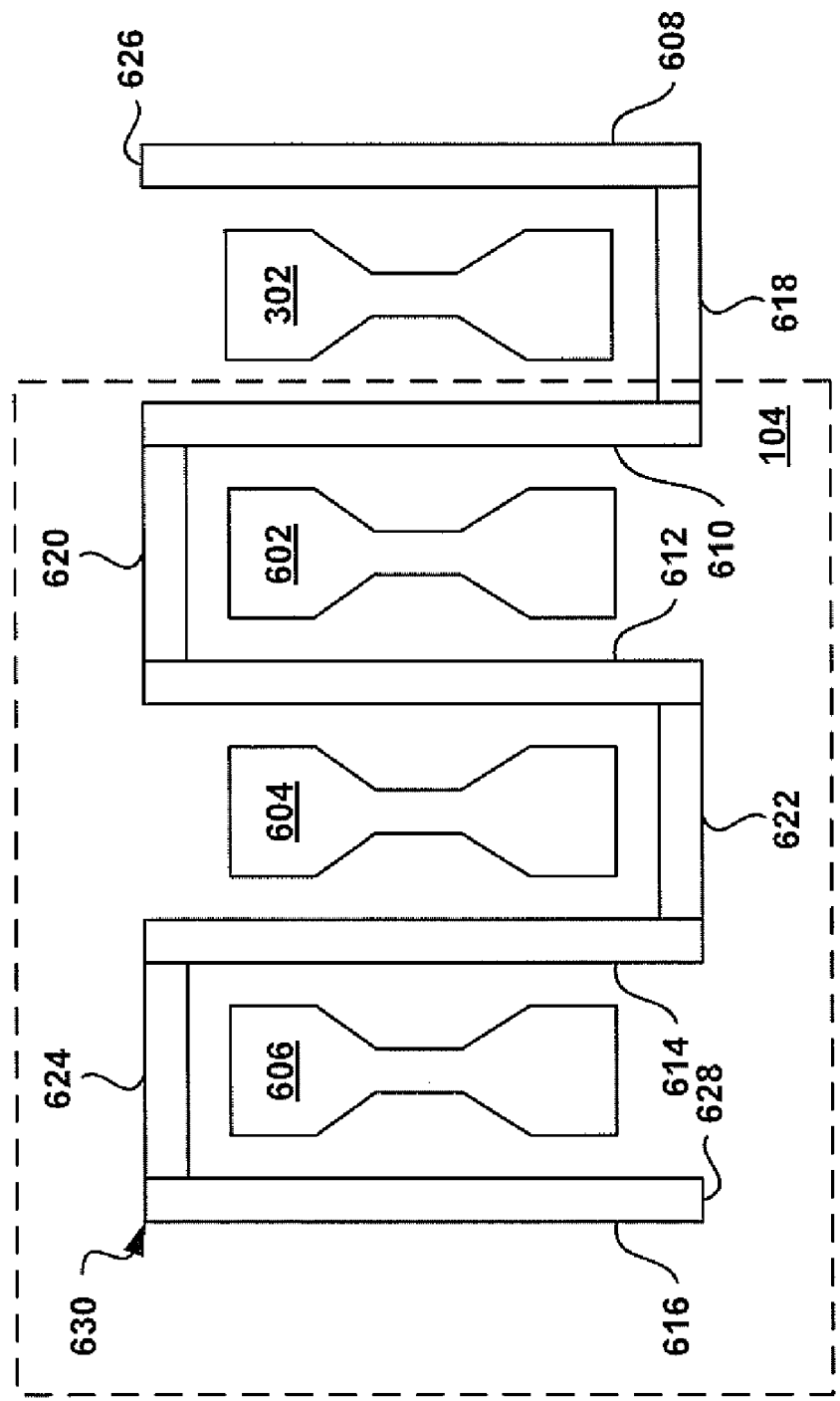
FIG. 6 is a diagram of another embodiment of a circuit arrangement.

FIG. 6 shows a diagrammatic illustration of another embodiment of a circuit arrangement in a plan view. A fuse 302 and a circuit 104 to be protected, which itself comprises a plurality of fuses 602, 604, 606, are shown in this case. A partial line element 610, 612, 614 is respectively arranged in a region between two fuses 302, 602, 604, 606. Partial line elements 608, 616 are also arranged in regions which are laterally beside the outer fuses 302, 606. The partial line elements 608, 610, 612, 614, 616 are serially connected to one another by means of connecting lines 618, 620, 622, 624. The connecting lines 618, 620, 622, 624 alternately run on the top side and on the underside of the fuses 302, 602, 604, 606 and respectively connect two partial line elements 608, 610, 612, 614, 616 to one another. The partial line elements 608, 610, 612, 614, 616 and the connecting lines 618, 620, 622, 624 thus together produce a line element 630 which is arranged around the fuses 302, 602, 604, 606 in meandering fashion and is used as a sensor element. A first connection 626 and a second connection 628 of the line element 630 may be coupled to an evaluation circuit 202, as illustrated in FIG. 2 and FIG. 3.

The arrangement illustrated in FIG. 6 may be used in a so-called fuse box. A fuse box is a collection of fuses at a particular location in a semiconductor module. A plurality of fuses are arranged beside one another in a row in the fuse box illustrated in FIG. 6, the distance between two fuses respectively being the same. If a fuse box is used, for example in an analog circuit part, to store a trimming value, not all of the fuses in the fuse box are programmed, depending on the trimming value. In order to prevent faulty behavior of the analog circuit part during operation, the trimming value programmed in the fuses must not change. It is necessary to detect when degradation spreads from a programmed fuse in the direction of an unprogrammed fuse. The arrangement illustrated in FIG. 6 detects degradation which starts from a fuse in the direction of the adjacent fuse. In this arrangement, a fuse simultaneously represents a region to be protected and an element from which degradation can start.

In the arrangement illustrated in FIG. 6, it is not only degradation in the region between two adjacent fuses which is detected but also degradation which extends into regions which are laterally beside the outer fuses 302, 606. Since the connecting lines 618, 620, 622, 624 alternately run on the top side and on the underside of the fuses 302, 602, 604, 606, degradation which extends in a direction above or below the fuses 302, 602, 604, 606 can be only partially detected.

Figure 7:
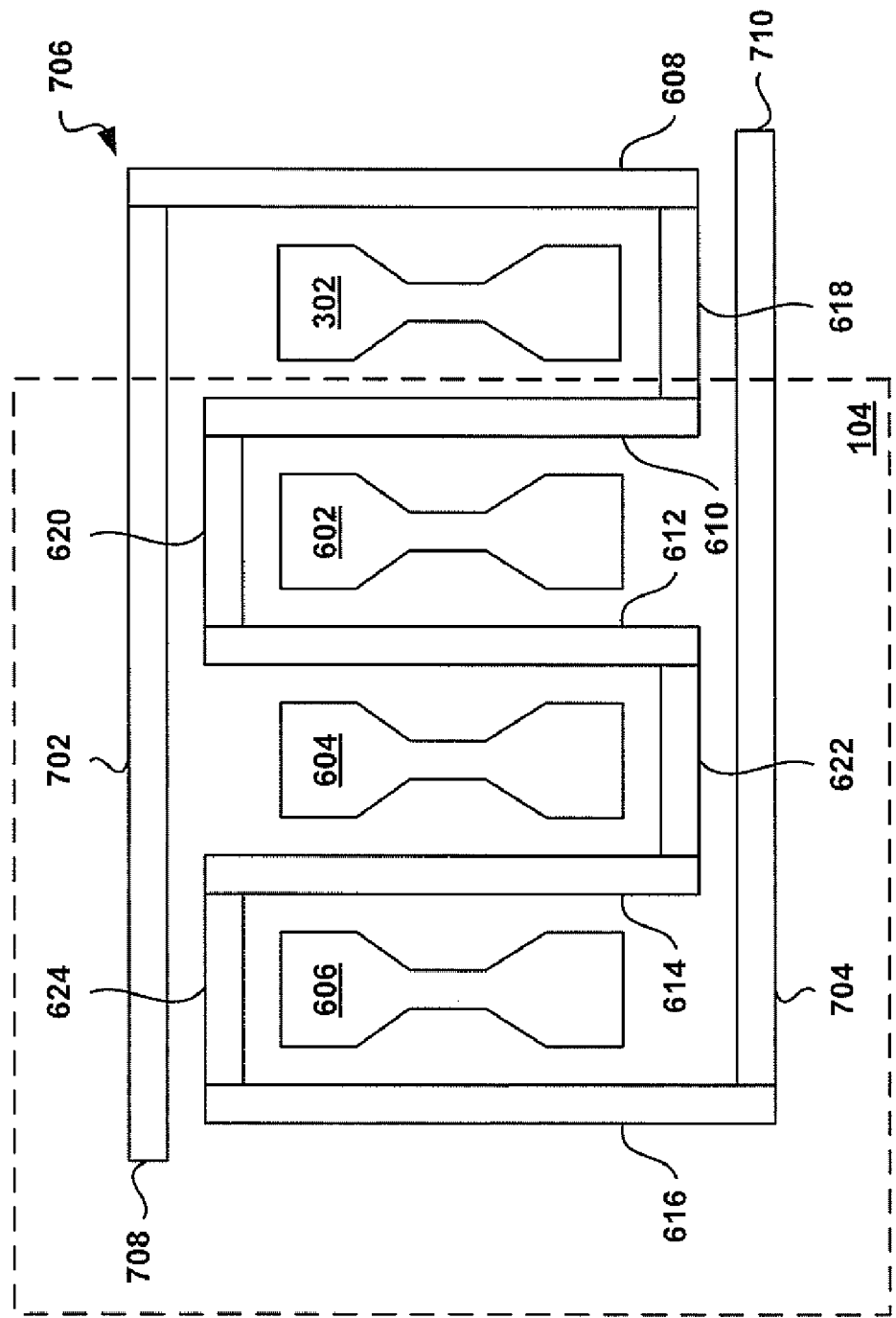
FIG. 7 is a diagram of another embodiment of a circuit arrangement.

FIG. 7 shows a diagrammatic illustration of another embodiment of a circuit arrangement in a plan view. In addition to the embodiment illustrated in FIG. 6, a partial line element 702 runs along the top side of the fuses 302, 602, 604, 606 and parallel to the connecting lines 620, 624. A connection of the partial line element 702 is connected to a connection of the partial line element 608. A partial line element 704 also runs along the underside of the fuses 302, 602, 604, 606 and parallel to the connecting lines 618, 622. A connection of the partial line element 704 is connected to a connection of the partial line element 616. The partial line elements 608, 610, 612, 614, 616, 702, 704 and the connecting lines 618, 620, 622, 624 together produce a line element 706 which is used as a sensor element. A first connection 708 and a second connection 710 of the line element 706 may be coupled to an evaluation circuit 202, as illustrated in FIG. 2 and FIG. 3. The line element 706 can be used to detect both degradation which extends into regions which are laterally beside the outer fuses 302, 606 and degradation which extends in a direction above or below the fuses 302, 602, 604, 606.

Figure 8:
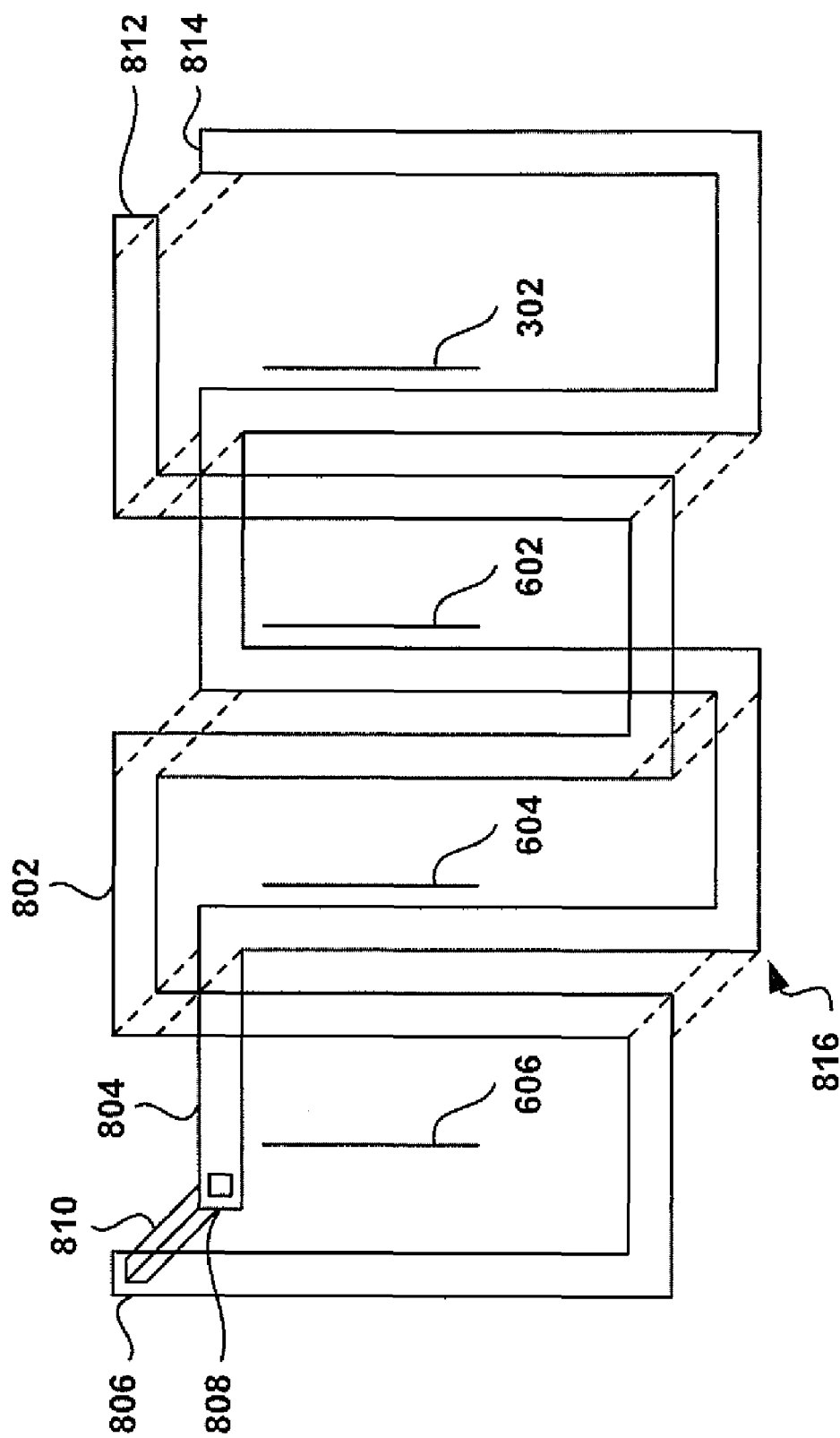
FIG. 8 is a diagram of another embodiment of a circuit arrangement.

FIG. 8 shows a diagrammatic illustration of another embodiment of a circuit arrangement in a perspective view. On account of clarity, the fuses 302, 602, 604, 606 in FIG. 8 are illustrated in simplified form as lines. A first partial line element 802 is arranged on the same conductor track plane as the fuses 302, 602, 604, 606 and runs through the fuses 302, 602, 604, 606 in meandering fashion in a similar manner to that in the embodiment illustrated in FIG. 6. A second partial line element 804 is arranged in a conductor track plane above the fuses 302, 602, 604, 606 and the first partial line element 802. The second partial line element 804 likewise runs in meandering fashion and is arranged such that it is offset from the first partial line element 802. The offset between the two partial line elements 802, 804 corresponds to the distance between two adjacent fuses. A first connection 806 of the first partial line element 802 and a first connection 808 of the second partial line element 804 are connected to one another via a plated-through hole 810. A second connection 812 of the first partial line element 802 and a second connection 814 of the second partial line element 804 may be coupled to an evaluation circuit 202, as illustrated in FIG. 2 and FIG. 3. The first partial line element 802, the second partial line element 804 and the plated-through hole 810 form a sensor element 816. Degradation which starts from a fuse usually spreads over a plurality of conductor track planes. Since the sensor element 816 completely surrounds each fuse, degradation can be detected irrespective of the direction in which it extends.

Figure 9:
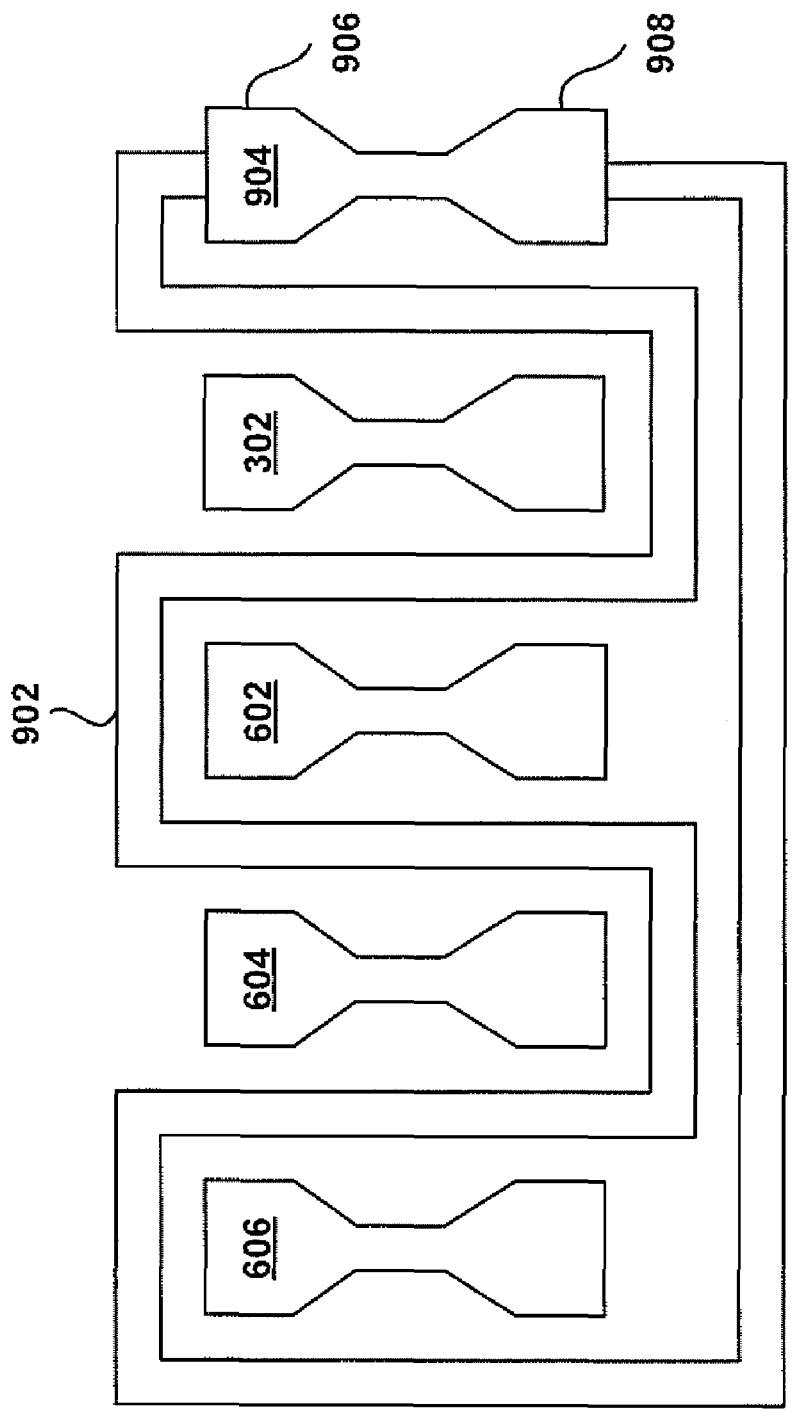
FIG. 9 is a diagram of another embodiment of a circuit arrangement.

FIG. 9 shows a diagrammatic illustration of another embodiment of a circuit arrangement. In a similar manner to that in the embodiment illustrated in FIG. 6, a line element 902 is arranged around the fuses 302, 602, 604, 606 in meandering fashion. An activation fuse 904 which is arranged adjacent to and in the same row as the fuses 302, 602, 604, 606 is also provided. The fuses 302, 602, 604, 606 and the activation fuse 904 may all belong to one fuse box. A first connection 906 of the activation fuse 904 is connected to a first connection of the line element 902 and a second connection 908 of the activation fuse 904 is connected to a second connection of the line element 902. The two connections 906, 908 of the activation fuse 904 may be coupled to an evaluation circuit 202, as illustrated in FIG. 2 and FIG. 3. If the activation fuse 904 is in an unprogrammed state, there is always a connection between the connections 906, 908 of the evaluation circuit 202 on account of the connection by means of the activation fuse 904. Degradation starting from the fuses 302, 602, 604, 606 cannot be detected by the evaluation circuit 202. After the activation fuse 904 has been programmed, the connection between the first connection 906 and the second connection 908 of the activation fuse 904 is severed. The connections 906, 908 of the evaluation circuit 202 are no longer connected to one another when the line element 902 has been severed on account of degradation. Degradation starting from the fuses 302, 602, 604, 606 can be detected by the evaluation circuit 202.

In the embodiment illustrated in FIG. 9, an apparatus for detecting degradation is deliberately activated. Activation is effected, after a semiconductor module has been actually produced, by programming the activation fuse 904. It is thus possible to fabricate semiconductor modules in a standard production process with a standard mask set and to activate the apparatus for detecting degradation only in some of the semiconductor modules.

Figure 10:
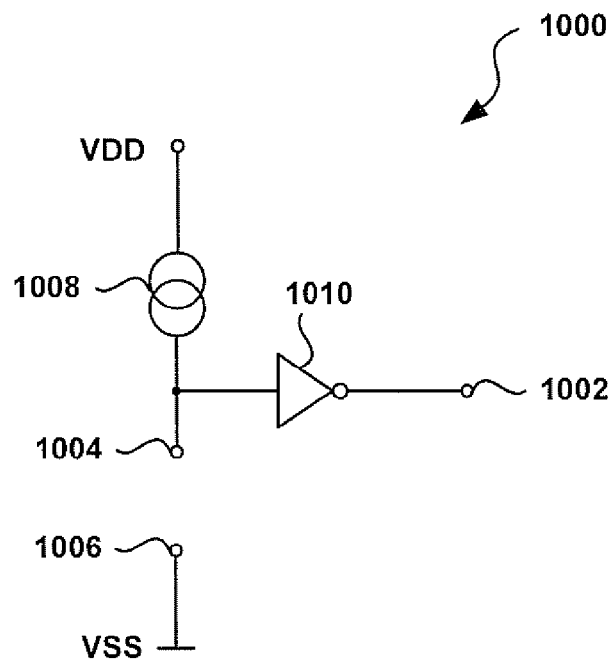
FIG. 10 shows an exemplary embodiment of an evaluation circuit illustrated in FIG. 2 and FIG. 3.

FIG. 10 shows an exemplary embodiment of an evaluation circuit 1000 which can be used for the evaluation circuit 202 diagrammatically illustrated in FIG. 2 and FIG. 3. At its output, the evaluation circuit 1000 provides a signal 1002 which corresponds to the signal 204 illustrated in FIG. 2 and FIG. 3. The evaluation circuit 1000 also has two inputs 1004, 1006 which may be connected to a sensor element illustrated in FIG. 1 to FIG. 9. Exemplary embodiments of a sensor element with two respective connections are shown in FIG. 6 to FIG. 9. The connections 626, 628 of the sensor element 630 which are illustrated in FIG. 6 may be coupled to the two inputs 1004, 1006 of the evaluation circuit 1000. In a corresponding manner, the connections 812, 814 illustrated in FIG. 8 and the connections 906, 908 illustrated in FIG. 9 may be coupled to the inputs 1004, 1006 of the evaluation circuit 1000.

The evaluation circuit 1000 illustrated in FIG. 10 comprises a current source 1008 and an inverter 1010, a first connection of the current source 1008 being connected to an input of the inverter 1010 and to the input 1004 of the evaluation circuit 1000. A second connection of the current source 1008 is connected to a supply voltage potential which corresponds to an operating voltage VDD. The input 1006 of the evaluation circuit 1000 is connected to a supply voltage potential which corresponds to a ground potential VSS.

If a sensor element which is coupled to the two inputs 1004, 1006 of the evaluation circuit 1000 is not affected by degradation, there is an electrical connection between the two inputs 1004, 1006 of the evaluation circuit 1000 and the ground potential VSS is applied to the input of the inverter 1010. The inverter 1010 outputs the value of a logic '1' at its output 1002. With the value of a logic '1' at its output 1002, the evaluation circuit 1000 indicates that there is no degradation.

If the sensor element which is coupled to the two inputs 1004, 1006 of the evaluation circuit 1000 is severed on account of degradation, there is no electrical connection between the two inputs 1004, 1006 of the evaluation circuit 1000. The operating voltage VDD is applied to the input of the inverter 1010, and the inverter 1010 outputs the value of a logic '0' at its output 1002. With the value of a logic '0' at its output 1002, the evaluation circuit 1000 indicates that degradation has occurred.

Figure 11:
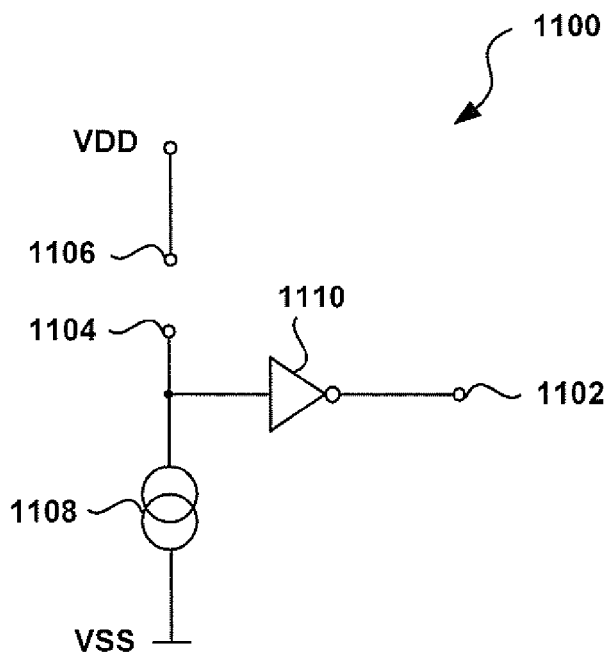
FIG. 11 shows another exemplary embodiment of an evaluation circuit illustrated in FIG. 2 and FIG. 3.

FIG. 11 shows another exemplary embodiment of an evaluation circuit 1100 which can be used for the evaluation circuit 202 diagrammatically illustrated in FIG. 2 and FIG. 3. In a similar manner to the evaluation circuit 1000 illustrated in FIG. 10, the evaluation circuit 1100 comprises an output with a signal 1102, two inputs 1104, 1106, a current source 1108 and an inverter 1110. In contrast to the evaluation circuit 1000 illustrated in FIG. 10, the input 1106 is connected to an operating voltage VDD and the second connection of the current source 1108 is connected to a ground potential VSS in the evaluation circuit 1100. The first connection of the current source 1108 is connected to the input 1104 of the evaluation circuit 1100 and to an input of the inverter 1110.

If a sensor element which is coupled to the two inputs 1104, 1106 is not affected by degradation, there is an electrical connection between the two inputs 1104, 1106 of the evaluation circuit 1100 and the operating potential VDD is applied to the input of the inverter 1110. The inverter 1110 outputs the value of a logic '0' at its output 1102. With the value of a logic '0' at its output 1102, the evaluation circuit 1100 indicates that there is no degradation.

If the sensor element which is coupled to the two inputs 1104, 1106 of the evaluation circuit 1100 is severed on account of degradation, there is no electrical connection between the two inputs 1104, 1106 of the evaluation circuit 1100. The ground potential VSS is applied to the input of the inverter 1110, and the inverter 1110 outputs the value of a logic '1' at its output 1102. With the value of a logic '1' at its output 1102, the evaluation circuit 1100 indicates that degradation has occurred.

In contrast to the evaluation circuit 1000, the evaluation circuit 1100 outputs the value of a logic '1' in the event of a fault, that is to say in the event of degradation, and outputs the value of a logic '0' during fault-free operation.

The evaluation circuit 1000 is particularly suitable for use in a semiconductor module whose semiconductor substrate is connected to an operating potential VDD. In this case, it is possible to detect not only when the sensor element has been severed on account of degradation but also when a connection is established between the sensor element and the substrate on account of degradation. A connection between the sensor element and the substrate causes the input of the inverter 1010 to be connected to the operating potential VDD and the value of a logic '0' to be applied to the output 1002 of the evaluation circuit 1000. The value of a logic '0' at the output 1002 of the evaluation circuit 1000 indicates a fault.

In a similar manner, the evaluation circuit 1100 is particularly suitable for use in a semiconductor module whose semiconductor substrate is connected to a ground potential VSS. In this case, it is possible to detect not only when the sensor element has been severed on account of degradation but also when a connection is established between the sensor element and the substrate on account of degradation. A connection between the sensor element and the substrate causes the input of the inverter 1110 to be connected to the ground potential VSS and the value of a logic '1' to be applied to the output 1102 of the evaluation circuit 1100. The value of a logic '1' at the output 1102 of the evaluation circuit 1100 indicates a fault.

Figure 12:
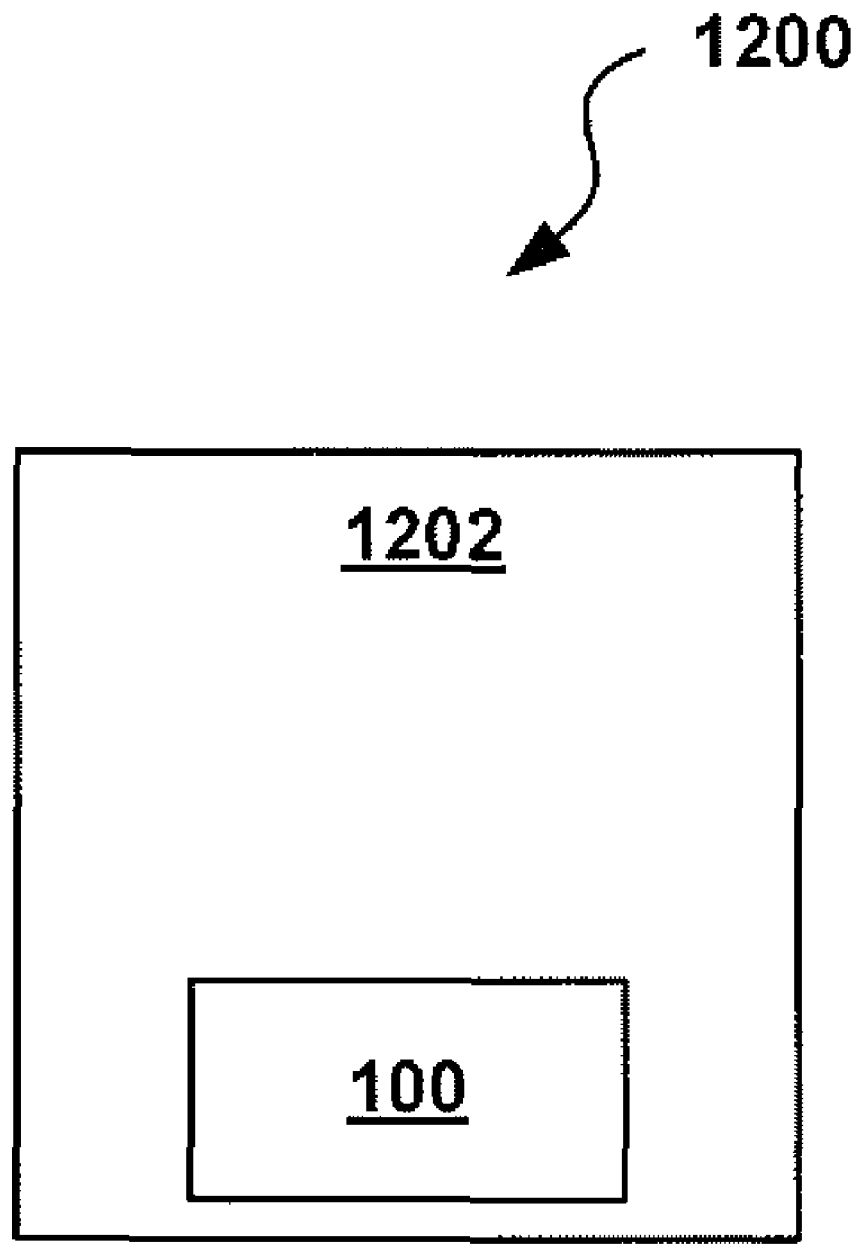
FIG. 12 shows a diagram of a system which is used in a motor vehicle.

FIG. 12 shows a diagrammatic illustration of a system 1200 which has a control unit 1202 and is used in a motor vehicle. The control unit 1202 comprises a circuit arrangement 100, as illustrated and described by way of example in connection with FIG. 1 to FIG. 9.

In one exemplary embodiment of the system 1200, the control unit is coupled to a drive apparatus. The control unit 1202 controls a braking operation of a wheel which is part of the drive apparatus. The control unit 1202 regulates a braking power of the motor vehicle in order to achieve a braking distance which is as short as possible. For example, the control unit 1202 is part of an antilock braking system and prevents the wheel from locking during a braking operation. In one embodiment, the control unit 1202 comprises a sensor which measures a speed of the wheel and comprises a circuit arrangement 100. The wheel speed sensor can be used to detect when the wheel threatens to lock and when the wheel locks.

In another exemplary embodiment of the system 1200, the control unit 1202 controls an occupant protection means. The occupant protection means is, for example, an airbag or a belt tensioner. The control unit 1202 triggers the airbag, for example, when the motor vehicle collides with an obstacle, in order to protect vehicle occupants from injury. In one embodiment, the control unit 1202 comprises a sensor which detects the acceleration of the motor vehicle and comprises a circuit arrangement 100. The acceleration sensor detects negative acceleration of the motor vehicle, which is caused by an impact, and the control unit 1202 then triggers the airbag.

In another exemplary embodiment of the system 1200, the drive apparatus comprises a motor system, and the control unit 1202 monitors an undervoltage of the motor system. The control unit 1202 triggers a reset signal, for example, when a voltage of the motor system undershoots a particular value.

In the embodiments of the system 1200 which are described with reference to FIG. 12, a circuit arrangement 100 is used in a safety-critical application, namely in a motor vehicle. In the system 1200, failure, for example of an airbag or an antilock braking system, must be prevented by all means and a correct method of operation of the circuit arrangement 100 must be ensured. The circuit arrangement 100 is suitable for use in such a safety-critical system since degradation of a fuse of the circuit arrangement 100 is detected even before the circuit arrangement 100 behaves in a faulty manner. In the event of degradation, it is thus possible to deactivate the circuit arrangement 100 even before it behaves in a faulty manner. For example, the circuit arrangement 100 may be integrated in a motor vehicle system in such a manner that the detection of degradation causes restarting of the motor vehicle to be prevented since correct behavior of an airbag, of an antilock braking system or of an undervoltage monitoring means of a motor system is no longer guaranteed.

In addition to a motor vehicle, there are other systems in which the circuit arrangement 100 can be used in a safety-critical application. For example, the circuit arrangement 100 can be used in a medical engineering system, in a reactor controller or in a traffic guidance system, for example for air traffic or rail traffic.

The invention claimed is:

1. A circuit arrangement comprising:
a fuse element;
a circuit part to be protected;
a region between the fuse element and the circuit part to be protected; and
a sensor element located in the region and configured for detecting degradation of the region.

2. The circuit arrangement of claim 1, further comprising: an evaluation circuit coupled to the sensor element.

3. The circuit arrangement of claim 2, wherein the evaluation circuit is coupled to the circuit part to be protected and wherein the evaluation circuit is configured to switch off the circuit part to be protected.

4. The circuit arrangement of claim 2, wherein the evaluation circuit includes an output terminal configured to provide a signal that is generated on the basis of a state of the sensor element.

5. The circuit arrangement of claim 1, wherein the fuse element includes a line element which can be severed in order to program the fuse element.

6. The circuit arrangement of claim 1 wherein the fuse element includes two partial line elements which are arranged at a distance from one another and can be connected to one another in order to program the fuse element.

7. The circuit arrangement of claim 1, wherein the fuse element is a fuse or antifuse which can be programmed by a laser.

8. The circuit arrangement of claim 1, wherein the fuse element is an electrically programmable fuse or an electrically programmable antifuse.

9. The circuit arrangement of claim 1, wherein the fuse element, the circuit part to be protected, and the sensor element are formed in an integrated semiconductor module.

10. The circuit arrangement of claim 9, wherein the sensor element includes a line element which is arranged in the same conductor track plane as the fuse element.

11. The circuit arrangement of claim 9, wherein the sensor element includes a line element which is arranged in a conductor track plane above the fuse element.

12. The circuit arrangement of claim 10 or 11, the line element being arranged in a metal plane.

13. The circuit arrangement of claim 9, wherein the sensor element includes two partial line elements which are arranged in two conductor track planes and are connected to one another by a plated-through hole.

14. The circuit arrangement of claim 1, wherein the circuit part to be protected includes a further fuse element.

15. The circuit arrangement of claim 1, wherein the circuit part to be protected includes a plurality of fuse elements, and a plurality of sensor elements, and each sensor element is respectively arranged in a region between two fuse elements, and the sensor elements being serially connected to one another.

16. The circuit arrangement of claim 14 or 15, wherein the circuit part to be protected includes a plurality of fuse elements, and the sensor element being in the form of a line element which is arranged around the fuse elements in meandering fashion.

17. A system for use in a motor vehicle, comprising:
a control unit which comprises a circuit arrangement that includes:
a fuse element;
a circuit part to be protected;
a region between the fuse element and the circuit part to be protected; and
a sensor element located in the region and configured for detecting degradation of the region.

18. The system of claim 17, further comprising a drive apparatus which can be coupled to the control unit.

19. The system of claim 18, wherein the drive apparatus includes a wheel.

20. The system of claim 19, wherein the control unit is configured to control a braking operation of the wheel.

21. The system of claim 20, wherein the control unit includes a sensor for detecting a speed of the wheel, and the sensor including the circuit arrangement.

22. The system of claim 18, wherein the drive apparatus includes a motor system, and the control unit configured to monitor an undervoltage of the motor system.

23. The system of claim 17, wherein the control unit is configured to control an occupant protection means.

24. The system of claim 23, wherein the occupant protection means includes an airbag and/or a belt tensioner.

25. The system of claim 17, wherein the control unit includes a sensor for detecting acceleration of the motor vehicle, and the sensor includes the circuit arrangement.

* * * * *